(12) United States Patent
Kanazawa et al.

(10) Patent No.: US 10,454,451 B2
(45) Date of Patent: Oct. 22, 2019

(54) FILTER DEVICE

(71) Applicant: Murata Manufacturing Co., Ltd., Nagaokakyo-shi, Kyoto-fu (JP)

(72) Inventors: Tomio Kanazawa, Nagaokakyo (JP); Norio Taniguchi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 56 days.

(21) Appl. No.: 15/630,985

(22) Filed: Jun. 23, 2017

(65) Prior Publication Data

US 2017/0294897 A1    Oct. 12, 2017

Related U.S. Application Data

(63) Continuation of application No. PCT/JP2016/050030, filed on Jan. 4, 2016.

(30) Foreign Application Priority Data

Jan. 7, 2015 (JP) .................................. 2015-001656

(51) Int. Cl.
*H03H 9/64* (2006.01)
*H03H 9/145* (2006.01)
(Continued)

(52) U.S. Cl.
CPC ...... *H03H 9/6489* (2013.01); *H03H 9/02559* (2013.01); *H03H 9/145* (2013.01);
(Continued)

(58) Field of Classification Search
CPC .. H03H 9/6489; H03H 9/02559; H03H 9/145; H03H 9/14538; H03H 9/14541; H03H 9/25
(Continued)

(56) References Cited

U.S. PATENT DOCUMENTS

2012/0274417 A1   11/2012   Kihara et al.
2013/0229242 A1    9/2013   Takata
(Continued)

FOREIGN PATENT DOCUMENTS

JP    2012-186642 A    9/2012
JP    2013-062556 A    4/2013
(Continued)

OTHER PUBLICATIONS

Official Communication issued in corresponding Korean Patent Application No. 10-2017-7018473, dated Jun. 4, 2018.
(Continued)

*Primary Examiner* — Stephen E. Jones
*Assistant Examiner* — Samuel S Outten
(74) *Attorney, Agent, or Firm* — Keating & Bennett, LLP

(57) ABSTRACT

A composite filter device includes a first filter and a plurality of second filters with different passbands. End portions of the first filter and the plurality of second filters are connected to a common connection. The first filter includes a piezoelectric substrate made of LiNbO$_3$, an IDT electrode provided on the piezoelectric substrate, and a dielectric layer provided on the piezoelectric substrate so as to cover the IDT electrode. The first filter utilizes a fundamental wave of Rayleigh waves. The passband of the first filter is arranged in a frequency band that is lower than any of the passbands of the plurality of second filters.

15 Claims, 8 Drawing Sheets

(51) Int. Cl.
*H03H 9/25* (2006.01)
*H03H 9/02* (2006.01)

(52) U.S. Cl.
CPC .... *H03H 9/14538* (2013.01); *H03H 9/14541* (2013.01); *H03H 9/25* (2013.01); *H03H 9/6483* (2013.01)

(58) Field of Classification Search
USPC ........................................................ 333/193
See application file for complete search history.

(56) References Cited

U.S. PATENT DOCUMENTS

| 2013/0300519 | A1 | 11/2013 | Tamasaki et al. | |
|---|---|---|---|---|
| 2014/0333392 | A1* | 11/2014 | Tsuda ................ | H03H 9/02992 333/133 |
| 2015/0270824 | A1 | 9/2015 | Sauer et al. | |

FOREIGN PATENT DOCUMENTS

| KR | 10-2012-0038889 A | 4/2012 | |
|---|---|---|---|
| KR | 10-2013-0103607 A | 9/2013 | |
| WO | 2012/063516 A1 | 5/2012 | |
| WO | 2012/098816 A1 | 7/2012 | |
| WO | WO-2013118532 A1 * | 8/2013 | ......... H03H 9/02992 |
| WO | 2014/075974 A1 | 5/2014 | |

OTHER PUBLICATIONS

Official Communication issued in International Patent Application No. PCT/JP2016/050030, dated Mar. 8, 2016.

* cited by examiner

FILTER DEVICE

CROSS REFERENCE TO RELATED APPLICATIONS

This application claims the benefit of priority to Japanese Patent Application No. 2015-001656 filed on Jan. 7, 2015 and is a Continuation Application of PCT Application No. PCT/JP2016/050030 filed on Jan. 4, 2016. The entire contents of each application are hereby incorporated herein by reference.

BACKGROUND OF THE INVENTION

1. Field of the Invention

The present invention relates to composite filter devices.

2. Description of the Related Art

In the related art, composite filter devices are widely used in cellular phones and or the like.

For example, Japanese Unexamined Patent Application Publication No. 2013-62556 described below discloses a multiplexer including three or more bandpass filters. In the multiplexer of Japanese Unexamined Patent Application Publication No. 2013-62556, these three or more bandpass filters are commonly connected to an antenna terminal.

In the multiplexer of Japanese Unexamined Patent Application Publication No. 2013-62556, however, the conductance component of each bandpass filter causes an increase in insertion loss of another bandpass filter that shares the common connection. To reduce the insertion loss, it is conceivable to use $LiNbO_3$ substrates with low loss as piezoelectric substrates for all of the bandpass filters. However, when $LiNbO_3$ is used, there arises a problem of higher cost.

SUMMARY OF THE INVENTION

Preferred embodiments of the present invention provide low-cost composite filter devices with lower insertion loss.

A composite filter device according to a preferred embodiment of the present invention includes a first filter, and a plurality of second filters having different passbands, wherein one end portions of the first filter and the plurality of second filters are connected to a common connection, the first filter includes a piezoelectric substrate made of $LiNbO_3$, an IDT electrode provided on the piezoelectric substrate, and a dielectric layer provided on the piezoelectric substrate so as to cover the IDT electrode, the first filter generates a fundamental wave of Rayleigh waves, and a passband of the first filter is in a frequency band that is lower than any of the passbands of the plurality of second filters.

In a composite filter device according to a preferred embodiment of the present invention, the composite filter device further includes an antenna terminal, and the one end portions of the first filter and the plurality of second filters are connected in common to the antenna terminal.

In a composite filter device according to a preferred embodiment of the present invention, the piezoelectric substrate of the first filter is preferably made of a rotated Y-cut $LiNbO_3$ with a cut angle between about 110° and about 150° inclusive, for example. In this case, the fundamental wave of Rayleigh waves may be appropriately utilized.

In a composite filter device according to a preferred embodiment of the present invention, the IDT electrode preferably includes a metal layer made of a metal having a density higher than about $7.87 \times 10^3$ kg/m³, for example. In this case, the first filter is able to reduce bulk wave emission across a wide range.

In a composite filter device according to a preferred embodiment of the present invention, the metal layer of the IDT electrode is preferably made of at least one kind of metal, out of Cu, Fe, Mo, Pt, W, Pd, Ta, Au, and Ag, for example. In this case, the first filter is able to reduce the bulk wave emission across a wide range.

In a composite filter device according to a preferred embodiment of the present invention, the passbands of the plurality of second filters are preferably in frequency bands that are lower than the frequency of a longitudinal wave of Rayleigh waves of the first filter. In this case, insertion loss is effectively reduced.

In a composite filter device according to a preferred embodiment of the present invention, the passbands of the plurality of second filters are preferably in frequency bands that satisfy the following Formula (1), where h is the thickness of the IDT electrode, ρ is the density of the IDT electrode, λ is a wavelength determined by the IDT electrode, f is a center frequency of the passband of the first filter, x is ρ×h/λ, and y is a frequency normalized by f.

$$1 < y < 2.392 \times 10^{-4} xx + 1.6246 \quad \text{Formula (1)}$$

In this case, the insertion loss is effectively reduced.

In a composite filter device according to a preferred embodiment of the present invention, the passbands of the plurality of second filters are preferably in frequency bands that are lower than the frequency of a fast transverse wave of Rayleigh waves of the first filter. In this case, the insertion loss is effectively reduced.

In a composite filter device according to a preferred embodiment of the present invention, the passbands of the plurality of second filters are preferably in frequency bands that satisfy the following Formula (2).

$$1 < y < 1.7358 \times 10^{-4} xx + 1.1781 \quad \text{Formula (2)}$$

In this case, the insertion loss is effectively reduced.

In a composite filter device according to a preferred embodiment of the present invention, the passbands of the plurality of second filters are preferably in frequency bands that are higher than the frequency of a fast transverse wave of Rayleigh waves of the first filter. In this case, the insertion loss is effectively reduced.

In a composite filter device according to a preferred embodiment of the present invention, the passbands of the plurality of second filters are preferably in frequency bands that satisfy the following Formula (3).

$$2.0032 \times 10^{-4} xx + 1.2138 < y < 2.392 \times 10^{-4} xx + 1.6246 \quad \text{Formula (3)}$$

In this case, the insertion loss is effectively reduced.

In a composite filter device according to a preferred embodiment of the present invention, of the plurality of second filters, the passband of at least one of the plurality of second filters is preferably in a frequency band that is lower than the frequency of a fast transverse wave of Rayleigh waves of the first filter, and the passband of a remaining one of the plurality of second filters is preferably in a frequency band that is higher than the frequency of the fast transverse wave of Rayleigh waves of the first filter. In this case, the insertion loss is effectively reduced.

In a composite filter device according to a preferred embodiment of the present invention, the passband of at least one of the plurality of second filters is preferably in a frequency band that satisfies the following Formula (2):

$$1 < y < 1.7358 \times 10^{-4} \times x + 1.1781 \quad \text{Formula (2)}$$

The passband of a remaining one of the plurality of second filters is preferably in a frequency band that satisfies the following Formula (3):

$$2.0032 \times 10^{-4} \times x + 1.2138 < y < 2.392 \times 10^{-4} \times x + 1.6246 \quad \text{Formula (3)}$$

In this case, the insertion loss is effectively reduced.

In a composite filter device according to a preferred embodiment of the present invention, at least one second filter of the plurality of second filters preferably includes a piezoelectric substrate made of LiTaO$_3$. In this case, the insertion loss and cost is reduced.

According to various preferred embodiments of the present invention, low-cost composite filter devices with lower insertion loss are provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, the present invention will be disclosed in detail by describing specific preferred embodiments of the present invention with reference to the drawings.

Each preferred embodiment described in the present specification is for illustrative purposes only, and elements or features of different preferred embodiments may be combined or partially exchanged.

Figure 1:
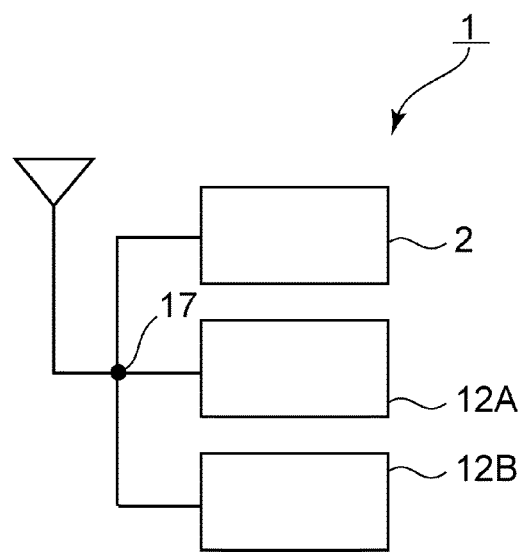
FIG. 1 is a block diagram of a composite filter device according to a first preferred embodiment of the present invention.

FIG. 1 is a block diagram of a composite filter device according to a first preferred embodiment of the present invention.

A composite filter device 1 includes a first filter 2 and a plurality of second filters 12A and 12B with different passbands. The number of the plurality of second filters 12A and 12B is not limited to any particular value.

The composite filter device 1 further includes an antenna terminal 17. One end portions of the first filter 2 and the plurality of second filters 12A and 12B are commonly connected to the antenna terminal 17.

Figure 2:
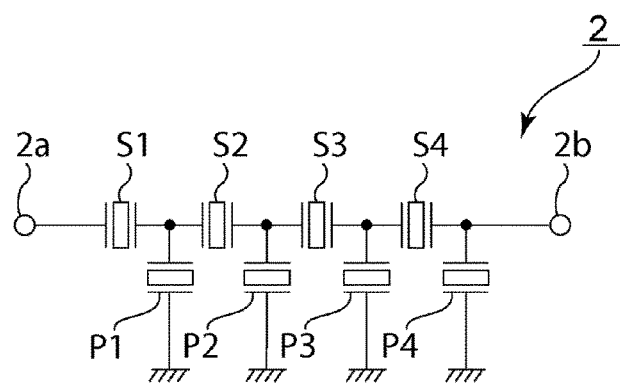
FIG. 2 is a circuit diagram of a first filter in the first preferred embodiment of the present invention.

FIG. 2 is a circuit diagram of the first filter in the first preferred embodiment.

The first filter 2 is preferably a ladder filter. The first filter 2 includes an input terminal 2a and an output terminal 2b. First to fourth series arm resonators S1 to S4 are connected between the input terminal 2a and the output terminal 2b. A first parallel arm resonator P1 is connected between a ground potential and a connection point between the first series arm resonator S1 and the second series arm resonator S2. A second parallel arm resonator P2 is connected between the ground potential and a connection point between the second series arm resonator S2 and the third series arm resonator S3. A third parallel arm resonator P3 is connected between the ground potential and a connection point between the third series arm resonator S3 and the fourth series arm resonator S4. A fourth parallel arm resonator P4 is connected between the ground potential and a connection point between the fourth series arm resonator S4 and the output terminal 2b. The circuit configuration of the first filter 2 is not limited to the configuration described above. The first to fourth series arm resonators S1 to S4 and the first to fourth parallel arm resonators P1 to P4 are each preferably defined by an elastic surface acoustic wave resonator.

Figure 3A:
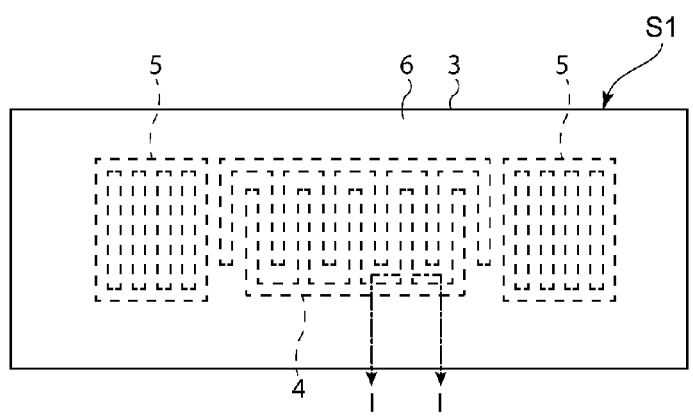
FIG. 3A is a plan view of a first series arm resonator included in the first filter in the first preferred embodiment of the present invention.
Figure 3B:
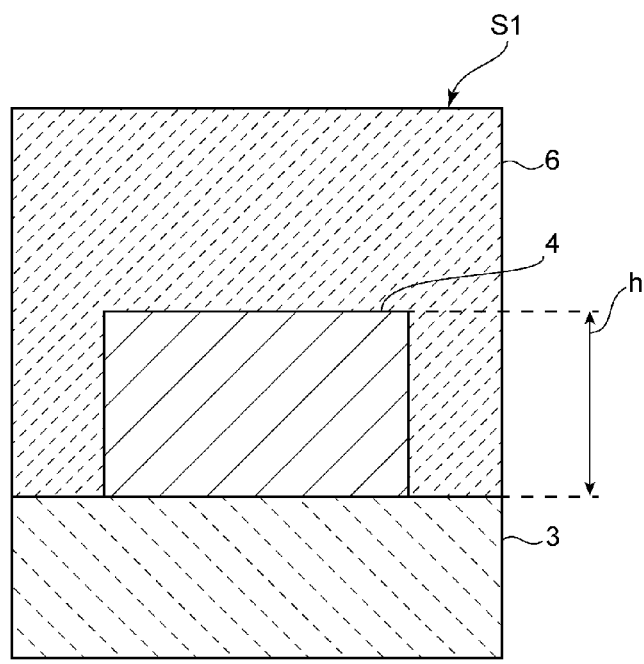
FIG. 3B is a cross-sectional view at line I-I of FIG. 3A.

FIG. 3A is a plan view of a first series arm resonator included in the first filter in the first preferred embodiment, and FIG. 3B is a cross-sectional view at line I-I of FIG. 3A.

The first series arm resonator S1 includes a piezoelectric substrate 3. The piezoelectric substrate 3 is preferably made of a rotated Y-cut LiNbO$_3$, for example. The first filter 2 utilizes a fundamental wave of Rayleigh wave. The cut angle of LiNbO$_3$ of the piezoelectric substrate 3 is not limited to any particular angle as long as the fundamental wave of Rayleigh waves can be utilized, and is preferably between about 110° and about 150° inclusive, for example. More preferably, the cut angle of LiNbO$_3$ of the piezoelectric substrate 3 preferably is between about 126° and about 130° inclusive, for example.

An interdigital (IDT) electrode 4 is provided on the piezoelectric substrate 3. Reflectors 5 are provided on both sides of the IDT electrode 4 along an elastic surface acoustic wave propagation direction. The IDT electrode 4 preferably includes a metal layer made of Pt, for example. The IDT electrode 4 is preferably made of a dense metal. This enables better excitation of the fundamental wave of Rayleigh wave. The IDT electrode 4 preferably includes a metal layer made of a metal whose density p is higher than about $7.87\times10^3$ kg/m$^3$. For example, the IDT electrode 4 preferably includes a metal layer made of at least one metal out of Cu, Fe, Mo, Pt, W, Pd, Ta, Au, and Ag.

Figure 4:
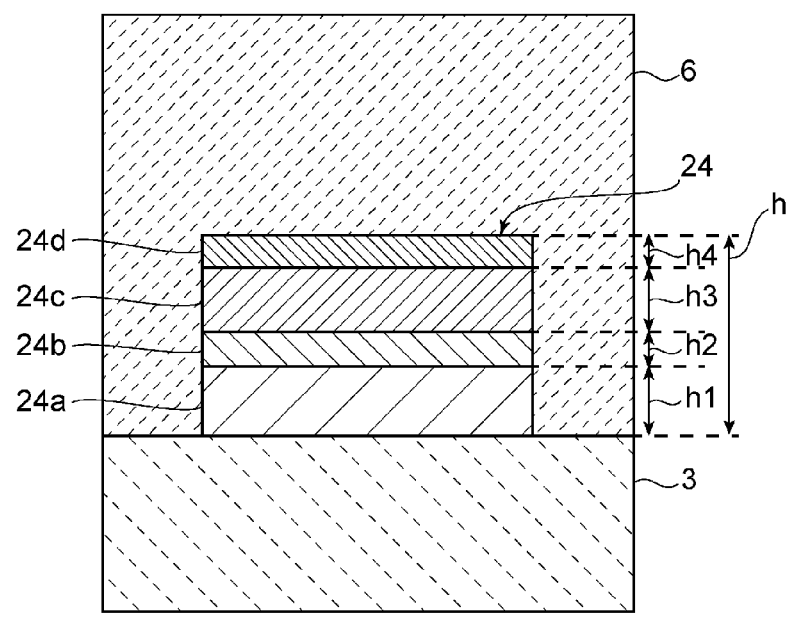
FIG. 4 is an expanded front cross-sectional view of a first filter in a first modified example of the first preferred embodiment of the present invention.

As in a modified example shown in FIG. 4, an IDT electrode 24 of the first filter may include a plurality of metal layers 24a to 24d. The number of the metal layers is not limited to any particular value.

Returning to FIG. 3B, a dielectric layer 6 is provided on the piezoelectric substrate 3 so as to cover the IDT electrode 4. The dielectric layer 6 is structured and configured to enable the generation of Rayleigh waves in the first series arm resonator S1. The dielectric layer 6 is preferably made of SiO$_2$, for example. The dielectric layer 6 may also be made of any suitable dielectric material other than SiO$_2$.

The second to fourth series arm resonators S2 to S4 and the first to fourth parallel arm resonators P1 to P4 each have a configuration that is the same as or similar to that of the first series arm resonator S1 and are provided on the same piezoelectric substrate 3. The first to fourth series arm resonators S1 to S4 and the first to fourth parallel arm resonators P1 to P4 have suitable thicknesses of IDT electrode and suitable electrode finger distances of IDT electrode, and define the first filter 2 depicted in FIG. 1.

The plurality of second filters 12A and 12B in the present preferred embodiment are also ladder filters each including a plurality of elastic surface acoustic wave resonators.

Figure 5:
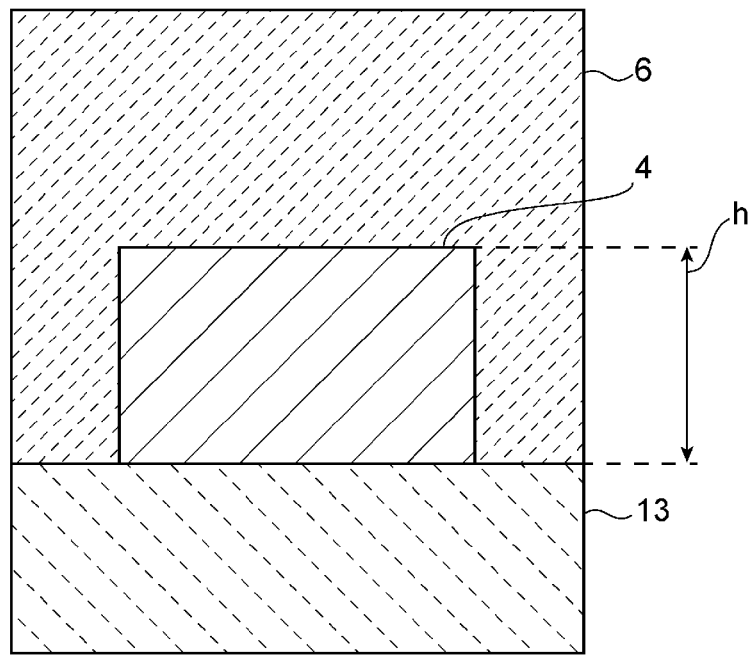
FIG. 5 is an expanded front cross-sectional view of an elastic surface acoustic wave resonator included in a second filter, which is one of a plurality of second filters in the first preferred embodiment of the present invention.

FIG. 5 is an expanded front cross-sectional view of an elastic surface acoustic wave resonator included in the second filter, which is one of the plurality of second filters in the first preferred embodiment of the present invention.

An elastic surface acoustic wave resonator included in the second filter 12A includes a piezoelectric substrate 13 preferably made of LiTaO$_3$ and utilizes Leaky waves. Alternatively, the elastic surface acoustic wave resonator described above may include a piezoelectric substrate made of a single piezoelectric crystal other than LiTaO$_3$ or piezoelectric ceramics or other suitable materials.

An elastic surface acoustic wave resonator included in the second filter 12B has a structure that is the same as or similar to that of the elastic surface acoustic wave resonator included in the second filter 12A.

The passband of the first filter 2 is in a frequency band that is lower than any of the passbands of the plurality of second filters 12A and 12B.

Figure 6:
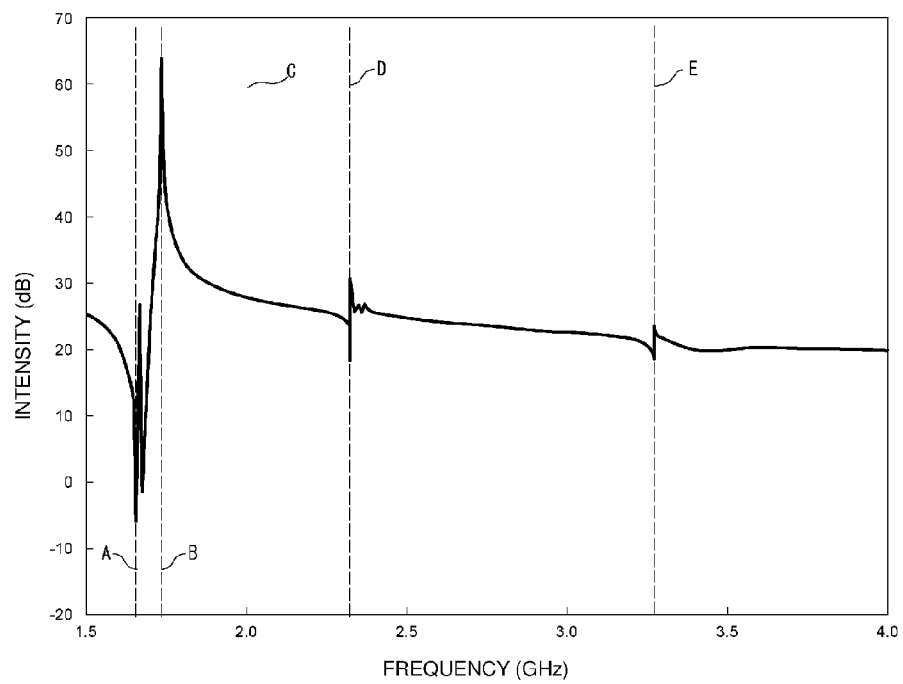
FIG. 6 is a graph representing the impedance characteristic of a first series arm resonator that is an example of an elastic surface acoustic wave resonator included in the first filter in the first preferred embodiment of the present invention.

FIG. 6 is a graph representing the impedance characteristic of a first series arm resonator that is an example of an elastic surface acoustic wave resonator included in the first filter in the first preferred embodiment of the present invention.

It can be seen that the intensity of Rayleigh wave greatly changes at frequencies represented by dash lines A, B, D, and E. The frequencies represented by dash lines A and B correspond to a resonant frequency and an anti-resonant frequency of the first series arm resonator S1 depicted in FIG. 2, respectively. The frequency represented by dash line D corresponds to the frequency of a fast transverse wave of Rayleigh waves. The frequency represented by dash line E corresponds to the frequency of a longitudinal wave of Rayleigh waves. The frequency represented by dash line C corresponds to the frequency of a slow transverse wave of Rayleigh waves. With respect to the resonant frequency, the anti-resonant frequency, the frequency of the slow transverse wave of Rayleigh waves, the frequency of the fast transverse wave of Rayleigh waves, and the frequency of the longitudinal wave of Rayleigh waves, the same relationships are also maintained at the second to fourth series arm resonators S2 to S4 and the first to fourth parallel arm resonators P1 to P4.

In the present preferred embodiment, the passbands of the plurality of second filters 12A and 12B shown in FIG. 1 are all lower than the frequencies of longitudinal waves of Rayleigh waves of the first to fourth series arm resonators S1 to S4 and the first to fourth parallel arm resonators P1 to P4, and are in the frequency bands that are other than the frequencies of the fast transverse waves. Furthermore, the passbands of the plurality of second filters 12A and 12B are arranged in the frequency bands that are higher than the passband of the first filter 2. This enables a reduction of insertion loss. Details are provided below.

Figure 7:
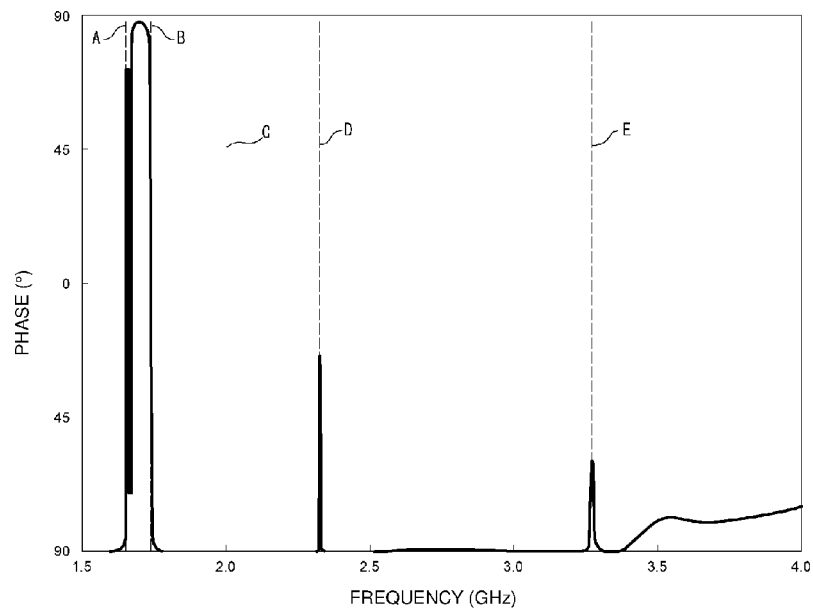
FIG. 7 is a graph representing the relationship between phase and frequency of Rayleigh wave in a first series arm resonator that is an example of the elastic surface acoustic wave resonator included in the first filter in the first preferred embodiment of the present invention.

FIG. 7 is a graph representing the relationship between phase and frequency of Rayleigh wave in the first series arm resonator that is an example of the elastic surface acoustic wave resonator included in the first filter in the first preferred embodiment.

It can be seen that the phase of Rayleigh wave greatly changes at the frequency of the fast transverse wave and the frequency of the longitudinal wave, which are represented by dash lines D and E. Furthermore, it can be seen that the phase of Rayleigh wave also greatly changes at a frequency band higher the frequency of the longitudinal wave. A larger phase change means a higher bulk wave emission. That is, the bulk wave emission of Rayleigh waves is higher at a frequency band equal to or higher than the frequency of the fast transverse wave and the frequency of the longitudinal wave. In other words, the bulk wave emission of Rayleigh waves is lower as long as a frequency is equal to or less than the frequency of the longitudinal wave and is other than the frequency of the fast transverse wave. The same applies to bulk wave emissions of Rayleigh waves of other elastic surface acoustic wave resonators used in the first filter 2. In this manner, the first filter 2 is able to reduce the bulk wave emission across a wide range.

The bulk wave emission of a resonator included in a filter of the composite filter device reduces the conductance of another filter that shares the common connection. This increases the insertion loss. In composite filter devices of the related art, the conductance of each filter is reduced by bulk wave emissions of resonators used in a plurality of filters, thus increasing the insertion loss.

For example, in the related art, a composite filter device includes filters that use elastic surface acoustic wave resonators utilizing Leaky waves propagating LiTaO$_3$ substrates or filters that use elastic surface acoustic wave resonators utilizing Love waves propagating LiNbO$_3$ substrates. In the foregoing elastic surface acoustic wave resonators in the composite filter devices, the bulk wave emission is higher at a frequency band higher than the resonant frequency or at a frequency band higher than the frequency of the slow transverse wave. Accordingly, as the passband of a filter becomes higher, the insertion loss of the filter increases.

On the other hand, the first filter 2 according to the present preferred embodiment is able to reduce the bulk wave emission of Rayleigh waves in each elastic surface acoustic wave resonator as long as a frequency is equal to or less than the frequency of the longitudinal wave of Rayleigh waves of each elastic surface acoustic wave resonator included in the first filter 2 and is other than the frequency of the fast transverse wave thereof. The passbands of the plurality of second filters 12A and 12B are all lower than the frequencies of longitudinal waves of Rayleigh waves of the first to fourth series arm resonators S1 to S4 and the first to fourth parallel arm resonators P1 to P4, and are arranged in the frequency bands that are other than the frequencies of the fast transverse waves thereof. Therefore, the plurality of second filters 12A and 12B are less susceptible to the bulk wave emissions of the first to fourth series arm resonators S1 to S4 and the first to fourth parallel arm resonators P1 to P4. Accordingly, the insertion losses of the plurality of second filters 12A and 12B are able to be reduced effectively.

Furthermore, the plurality of second filters 12A and 12B each include a piezoelectric substrate made of LiTaO$_3$ and utilize Leaky waves. The bulk wave emission of Leaky waves of an elastic surface acoustic wave resonator using the LiTaO$_3$ substrate is extremely low at a frequency band lower than the resonant frequency of the elastic surface acoustic wave resonator.

In the present preferred embodiment, the passband of the first filter 2 is in a frequency band that is lower than any of the passbands of the plurality of second filters 12A and 12B. Accordingly, the insertion loss of the first filter 2 is also effectively reduced.

All of the piezoelectric substrates of the plurality of second filters 12A and 12B are preferably low-cost LiTaO$_3$ substrates. Accordingly, the insertion losses of the first filter 2 and the plurality of second filters 12A and 12B are able to be reduced effectively, and the cost is able to be reduced as well.

Figure 8:
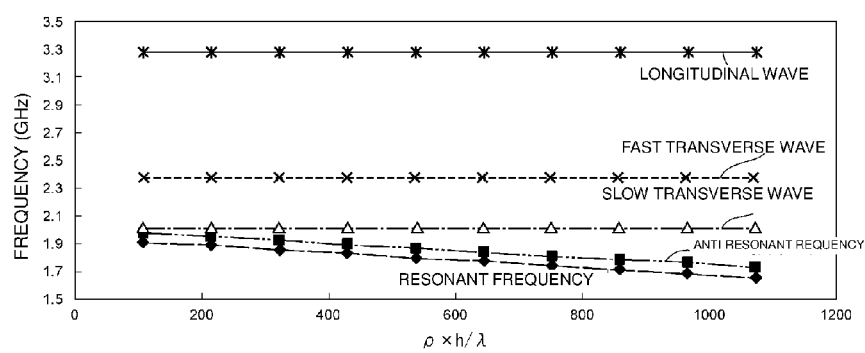
FIG. 8 is a graph representing relationships between ρ×h/λ of an IDT electrode and respective frequencies of Rayleigh waves in a first series arm resonator that is an example of the elastic surface acoustic wave resonator included in the first filter in the first preferred embodiment of the present invention.

FIG. 8 is a graph representing the relationships between $\rho \times h/\lambda$ of the IDT electrode and respective frequencies of Rayleigh waves in a first series arm resonator that is an example of the elastic surface acoustic wave resonator included in the first filter in the first preferred embodiment of the present invention. A solid line represents the frequency of longitudinal wave, a short-period dashed line represents the frequency of fast transverse wave, a dashed-dotted line represents the frequency of slow transverse wave, a dashed-two-dotted line represents the anti-resonant frequency, and a long-period dashed line represents the resonant frequency. Here, $\rho$ is the density of a metal used for the IDT electrode, h is the thickness of the IDT electrode, and $\lambda$ is the wavelength of a wave excited by the IDT electrode.

As $\rho \times h/\lambda$ of the IDT electrode 4 of the first series arm resonator S1 shown in FIG. 3B increases, the anti-resonant frequency and the resonant frequency of the first series arm resonator S1 become smaller. On the other hand, the frequencies of the longitudinal wave, the fast transverse wave, and the slow transverse wave stay constant regardless of the value of $\rho \times h/\lambda$. Therefore, by making $\rho \times h/\lambda$ of the IDT electrode 4 larger, it is possible to increase the difference between the frequency of longitudinal wave and the anti-resonant frequency of the first series arm resonator S1 and the difference between the frequency of longitudinal wave and the resonant frequency of the first series arm resonator S1. The same applies to other elastic surface acoustic wave resonators used in the first filter 2. Therefore, using the IDT electrode with a large $\rho \times h/\lambda$ in each elastic surface acoustic wave resonator enables the increase in the frequency difference between the passband of the first filter 2 and the longitudinal wave of each elastic surface acoustic wave resonator. This widens an area within which the passbands of the plurality of second filters 12A and 12B may be set. Accordingly, the passbands of the plurality of second filters 12A and 12B may be widened further, or it possible to provide a larger number of passbands of the second filters.

Figure 9:
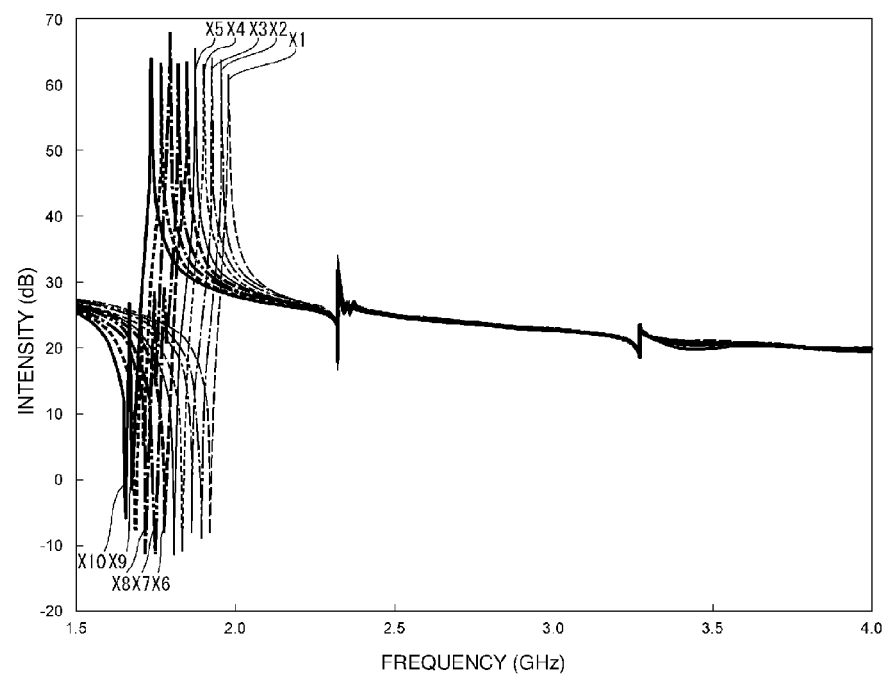
FIG. 9 is a graph representing impedance characteristics of respective first series arm resonators having different thicknesses of IDT electrode in the first preferred embodiment of the present invention.
Figure 10:
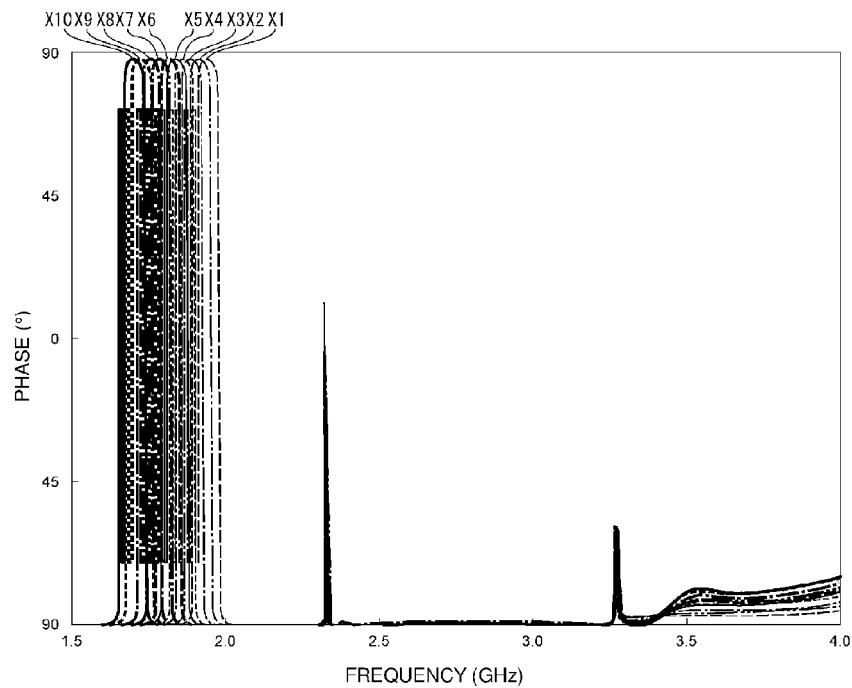
FIG. 10 is a graph representing relationships between phase and frequency of Rayleigh wave of respective first series arm resonators having different thicknesses of IDT electrode in the first preferred embodiment of the present invention.

FIG. 9 is a graph representing impedance characteristics of respective first series arm resonators having different thicknesses of IDT electrode in the first preferred embodiment. FIG. 10 is a graph representing the relationships between phase and frequency of Rayleigh wave of respective first series arm resonators having different thicknesses of IDT electrode in the first preferred embodiment. X1 to X10 respectively represent the first series arm resonators having different thicknesses of IDT electrode.

X1 to X10 differ from each other only in the thickness of IDT electrode. The values of h/$\lambda$ in X1 to X10 are respectively specified in the following Table 1.

TABLE 1

|  | X1 | X2 | X3 | X4 | X5 | X6 | X7 | X8 | X9 | X10 |
|---|---|---|---|---|---|---|---|---|---|---|
| IDT Electrode Film Thickness: h/$\lambda$ (%) | 0.5 | 1 | 1.5 | 2 | 2.5 | 3 | 3.5 | 4 | 4.5 | 5 |
| Resonant Frequency (GHz) | 1.914 | 1.888 | 1.86 | 1.83 | 1.802 | 1.772 | 1.744 | 1.716 | 1.686 | 1.656 |
| Anti-resonant Frequency (GHz) | 1.978 | 1.952 | 1.926 | 1.9 | 1.872 | 1.844 | 1.818 | 1.79 | 1.764 | 1.736 |

As specified in Table 1, the value of h/$\lambda$ is determined such that X1 has the smallest value of h/$\lambda$, and from X1 to X10, the value of h/$\lambda$ increases sequentially. Here, the thickness of IDT electrode is the only difference among X1 to X10. Thus, the value of $\rho \times h/\lambda$ is also the smallest in X1, and from X1 to X10, the value of $\rho \times h/\lambda$ increases sequentially. As depicted in FIG. 9 and FIG. 10, it can be seen that the difference between the frequency of the longitudinal wave and the anti-resonant frequency of the first series arm resonator and the difference between the frequency of the longitudinal wave and the resonant frequency thereof are the smallest in X1, and from X1 to X10, these differences increase sequentially. Thus, it can be seen that, as $\rho \times h/\lambda$ of the IDT electrode used in the first series arm resonator increases, the difference between the frequency of the longitudinal wave and the anti-resonant frequency and the difference between the frequency of the longitudinal wave and the resonant frequency become larger.

When four metal layers 24a to 24d are included as in the modified example shown in FIG. 4, $\rho \times h/\lambda$ may be calculated using the following formula. Here, h1 to h4 are the thicknesses of respective metal layers 24a to 24d.

$$\rho \times h/\lambda = \rho 1 \times h1/\lambda + \rho 2 \times h2/\lambda + \rho 3 \times h3/\lambda + \rho 4 \times h4/\lambda$$

Similarly, when the metal layer includes a plurality of layers, which is other than four layers, $\rho \times h/\lambda$ of IDT electrode may be obtained by calculating the product of the density and a normalized thickness, which is a thickness normalized by the wavelength of the first filter, of each metal layer and by calculating the sum of the foregoing products calculated for all the metal layers.

Figure 11:
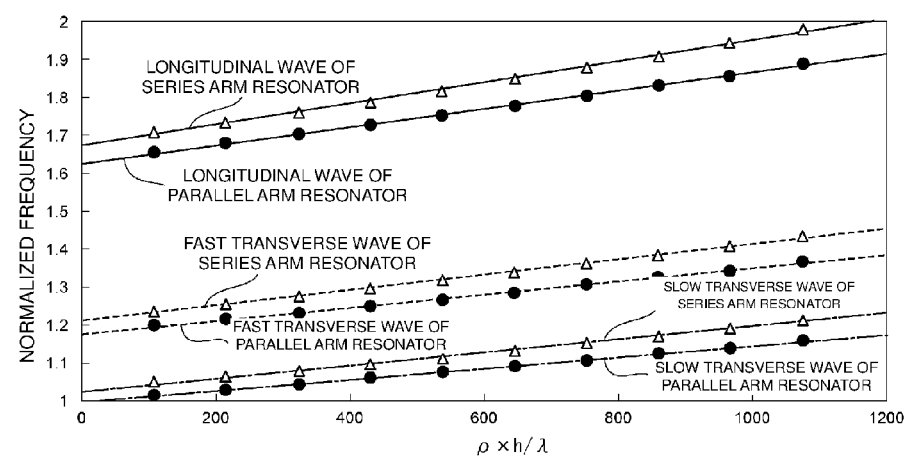
FIG. 11 is a graph representing relationships between ρ×h/λ of an IDT electrode and respective normalized frequencies, the normalized frequencies being frequencies of Rayleigh waves of the first series arm resonator and a first parallel arm resonator that are normalized by the center frequency of passband of the first filter, the first series arm resonator and the first parallel arm resonator being included in the first filter in the first preferred embodiment of the present invention.

FIG. 11 is a view representing the relationships between $\rho \times h/\lambda$ of the IDT electrode and respective normalized frequencies. Here, the normalized frequencies are frequencies of Rayleigh waves of the first series arm resonator and the first parallel arm resonator that are normalized by the center frequency of passband of the first filter, and the first series arm resonator and the first parallel arm resonator are preferably being used in the first filter in the first preferred embodiment of the present invention. The solid line connecting triangular marks represents the longitudinal wave of series arm resonator, the solid line connecting circular marks represents the longitudinal wave of parallel arm resonator, the dashed line connecting triangular marks represents the fast transverse wave of series arm resonator, the dashed line connecting circular marks represents the fast transverse wave of parallel arm resonator, the dashed-dotted line connecting triangular marks represents the slow transverse wave of series arm resonator, and the dashed-dotted line connecting circular marks represents the slow transverse wave of parallel arm resonator.

Each normalized frequency in the first series arm resonator S1 depicted in FIG. 2 is proportional to $\rho \times h/\lambda$ of the IDT electrode of the first series arm resonator. Each normalized frequency in the first parallel arm resonator P1 is proportional to $\rho \times h/\lambda$ of the IDT electrode of the first parallel arm resonator. Similarly, the normalized frequencies of the second to fourth series arm resonators S2 to S4 and the second to fourth parallel arm resonators P2 to P4 are proportional to $\rho \times h/\lambda$ of their respective IDT electrodes. Each normalized frequency in the first series arm resonator S1 is the highest in every $\rho \times h/\lambda$ among the first to fourth series arm resonators S1 to S4 and the first to fourth parallel arm resonators P1 to P4. Each normalized frequency in the first parallel arm resonator P1 is the lowest in every $\rho \times h/\lambda$ among the first to fourth series arm resonators S1 to S4 and the first to fourth parallel arm resonators P1 to P4. Relational expressions between $\rho \times h/\lambda$ and respective normalized frequencies of the longitudinal wave, the fast transverse wave, and the slow transverse wave of the first series arm resonator S1 and the first parallel arm resonator P1 are shown in the following Table 2.

TABLE 2

| | |
|---|---|
| Longitudinal Wave of Series Arm Resonator | $2.762 \times 10^{-4} \times x + 1.6739$ |
| Longitudinal Wave of Parallel Arm Resonator | $2.392 \times 10^{-4} \times x + 1.6246$ |
| Fast Transverse Wave of Series Arm Resonator | $2.0032 \times 10^{-4} \times x + 1.2138$ |
| Fast Transverse Wave of Parallel Arm Resonator | $1.7358 \times 10^{-4} \times x + 1.1781$ |
| Slow Transverse Wave of Series Arm Resonator | $1.6996 \times 10^{-4} \times x + 1.0299$ |
| Slow Transverse Wave of Parallel Arm Resonator | $1.4723 \times 10^{-4} \times x + 0.9995$ |

As described above, the insertion loss is able to be effectively reduced by setting the passbands of the plurality of second filters 12A and 12B lower than any of the normalized frequencies of the longitudinal waves of Rayleigh waves of the first to fourth series arm resonators S1 to S4 and the first to fourth parallel arm resonators P1 to P4 used in the first filter 2, and by further setting these passbands of the plurality of second filters 12A and 12B in the frequency bands that are higher than the passband of the first filter 2. This condition is specified by the following Formula (1). Here, x is $\rho \times h/\lambda$, and y is the normalized frequency that is normalized by the center frequency f of the passband of the first filter 2.

$$1 < y < 2.392 \times 10^{-4} \times x + 1.6246 \qquad \text{Formula (1)}$$

The insertion loss is able to be effectively reduced by arranging the passbands of the plurality of second filters 12A and 12B in frequency bands that satisfy the condition of Formula (1).

As described above, the insertion loss is able to be effectively reduced by setting the passbands of the plurality of second filters 12A and 12B lower than any of the normalized frequencies of the longitudinal waves of Rayleigh waves of the first to fourth series arm resonators S1 to S4 and the first to fourth parallel arm resonators P1 to P4 used in the first filter 2, and by further setting these passbands of the plurality of second filters 12A and 12B in the frequency bands that are different from the normalized frequency of the fast transverse wave. This condition is specified by the following Formula (2) and Formula (3). When the passbands of the plurality of second filters 12A and 12B are set in the frequency bands that are lower than any of the normalized frequencies of the fast transverse waves of the first to fourth series arm resonators S1 to S4 and the first to fourth parallel arm resonators P1 to P4, the condition is specified by the following Formula (2).

$$1 < y < 1.7358 \times 10^{-4} \times x + 1.1781 \qquad \text{Formula (2)}$$

When the passbands of the plurality of second filters 12A and 12B are set in the frequency bands that are higher than any of the normalized frequencies of the fast transverse waves of the first to fourth series arm resonators S1 to S4 and the first to fourth parallel arm resonators P1 to P4, the condition is specified by the following Formula (3).

$$2.0032 \times 10^{-4} \times x + 1.2138 < y < 2.392 \times 10^{-4} \times x + 1.6246 \qquad \text{Formula (3)}$$

All of the passbands of the second filters 12A and 12B may satisfy the condition of Formula (2) or all the passbands of the second filters 12A and 12B may satisfy the condition of Formula (3). Alternatively, of the plurality of second filters 12A and 12B, at least one second filter 12A may satisfy the condition of Formula (2), and the remaining second filter 12B may satisfy the condition of Formula (3). In any of the foregoing cases, the insertion loss is effectively reduced.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. A composite filter device comprising:
   a first filter; and
   a plurality of second filters with different passbands from one another; wherein
   first end portions of the first filter and the plurality of second filters are connected to a common connection;
   the first filter includes a piezoelectric substrate made of LiNbO$_3$, an IDT electrode provided on the piezoelectric substrate, and a dielectric layer provided on the piezoelectric substrate so as to cover the IDT electrode;
   the first filter generates a fundamental wave of Rayleigh waves;

a passband of the first filter is in a frequency band that is lower than any of the passbands of the plurality of second filters;

at least one of the plurality of second filters utilizes Leaky waves;

the passbands of the plurality of second filters are in frequency bands that are lower than a frequency of a longitudinal wave of Rayleigh waves of the first filter; and the passbands of the plurality of second filters are in frequency bands that satisfy Formula (1):

$$1<y<2.392\times10^{-4}xx+1.6246 \quad \text{Formula (1)}$$

where h is a thickness of the IDT electrode, $\rho$ is a density of the IDT electrode, $\lambda$ is a wavelength determined by the IDT electrode, f is a center frequency of the passband of the first filter, x is $\rho\times h/\lambda$, and y is a frequency normalized by f.

2. The composite filter device according to claim 1, wherein the IDT electrode includes a metal layer made of a metal with a density higher than about $7.87\times10^3$ kg/m$^3$.

3. The composite filter device according to claim 2, wherein the metal layer of the IDT electrode is made of at least one metal out of Cu, Fe, Mo, Pt, W, Pd, Ta, Au, and Ag.

4. The composite filter device according to claim 1, wherein the passbands of the plurality of second filters are in frequency bands that are lower than a frequency of a fast transverse wave of Rayleigh waves of the first filter.

5. The composite filter device according to claim 4, wherein the passbands of the plurality of second filters are in frequency bands that satisfy Formula (2):

$$1<y<1.7358\times10^{-4}xx+1.1781 \quad \text{Formula (2)}.$$

6. The composite filter device according to claim 1, wherein the passbands of the plurality of second filters are in frequency bands that are higher than a frequency of a fast transverse wave of Rayleigh waves of the first filter.

7. The composite filter device according to claim 6, wherein the passbands of the plurality of second filters are in frequency bands that satisfy Formula (3):

$$2.0032\times10^{-4}xx+1.2138<y<2.392\times10^{-4}xx+1.6246 \quad \text{Formula (3)}.$$

8. The composite filter device according to claim 1, wherein the passband of at least one of the plurality of second filters is in a frequency band that is lower than a frequency of a fast transverse wave of Rayleigh waves of the first filter, and the passband of a remaining one of the plurality of second filters is in a frequency band that is higher than the frequency of the fast transverse wave of Rayleigh waves of the first filter.

9. The composite filter device according to claim 8, wherein the passband of at least one of the plurality of second filters is in a frequency band that satisfies Formula (2):

$$1<y<1.7358\times10^{-4}xx+1.1781 \quad \text{Formula (2)}$$

and the passband of a remaining one of the plurality of second filters is in a frequency band that satisfies Formula (3):

$$2.0032\times10^{-4}xx+1.2138<y<2.392\times10^{-4}xx+1.6246 \quad \text{Formula (3)}.$$

10. The composite filter device according to claim 1, wherein the first filter is a ladder filter.

11. The composite filter device according to claim 10, wherein the first filter includes:

an input terminal;

an output terminal;

first, second, third and fourth series arm resonators connected between the input terminal and the output terminal;

a first parallel arm resonator connected between a ground potential and a connection point between the first and second series arm resonators;

a second parallel arm resonator connected between the ground potential and a connection point between the second and third series arm resonators;

a third parallel arm resonator connected between the ground potential and a connection point between the third and fourth series arm resonators; and a fourth parallel arm resonator connected between the ground potential and a connection point between the fourth series arm resonator and the output terminal.

12. The composite filter device according to claim 1, further comprising:

an antenna terminal; wherein the first end portions of the first filter and the plurality of second filters are commonly connected to the antenna terminal.

13. The composite filter device according to claim 1, wherein the piezoelectric substrate of the first filter is made of rotated Y-cut LiNbO$_3$ with a cut angle between about 110° and about 150° inclusive.

14. The composite filter device according to claim 1, wherein at least one second filter of the plurality of second filters includes a piezoelectric substrate made of LiTaO$_3$.

15. The composite filter device according to claim 1, wherein the piezoelectric substrate of the first filter is made of a rotated Y-cut LiNbO$_3$ with a cut angle between about 126° and about 130° inclusive.

\* \* \* \* \*